United States Patent
Fournel et al.

(10) Patent No.: US 7,258,743 B2
(45) Date of Patent: Aug. 21, 2007

(54) COMPOSITE STRUCTURE WITH A UNIFORM CRYSTAL ORIENTATION AND THE METHOD OF CONTROLLING THE CRYSTAL ORIENTATION OF ONE SUCH STRUCTURE

(75) Inventors: Franck Fournel, Moirans (FR); Bernard Aspar, Rives (FR); Hubert Moriceau, St. Egreve (FR)

(73) Assignee: Commissariat A L'Energie Atomique, Paris (FR)

( * ) Notice: Subject to any disclaimer, the term of this patent is extended or adjusted under 35 U.S.C. 154(b) by 604 days.

(21) Appl. No.: 10/362,278

(22) PCT Filed: Jun. 20, 2002

(86) PCT No.: PCT/FR02/02136

§ 371 (c)(1),
(2), (4) Date: Feb. 20, 2003

(87) PCT Pub. No.: WO03/005443

PCT Pub. Date: Jan. 16, 2003

(65) Prior Publication Data

US 2003/0175531 A1 Sep. 18, 2003

(30) Foreign Application Priority Data

Jun. 22, 2001 (FR) .................................. 01 08257

(51) Int. Cl.
*C30B 33/00* (2006.01)
(52) U.S. Cl. ...................... 117/101; 117/902
(58) Field of Classification Search ........... 117/902
See application file for complete search history.

(56) References Cited

U.S. PATENT DOCUMENTS

| 5,902,687 A | 5/1999 | Ohashi et al. |
| 2002/0089016 A1 | 7/2002 | Joly et al. .................... 257/349 |

FOREIGN PATENT DOCUMENTS

| EP | 1041630 | 4/2000 |
| FR | 2781082 | 10/1998 |
| JP | 611558152 | 7/1986 |
| WO | WO-0100522 | 1/2001 |
| WO | WO-0142540 | 6/2001 |

OTHER PUBLICATIONS

Nanometric Patterning With Ultrthin Twist Bonded Silicon Wafers—Thin solid films (F. Fournel; H. Moriceau,; N, Magnea; J. Eymery.; D. Buttard, ; J. L. Rouviere.

*Primary Examiner*—Jennifer McNeil
*Assistant Examiner*—Timothy M. Speer
(74) *Attorney, Agent, or Firm*—Thelen Reid Brown Raysman & Steiner LLP (57) ABSTRACT

This invention relates to a process for controlling the orientation of secondary structures (A1, A2) with at least a crystalline part during the transfer of secondary structures from a primary structure (A) on which the secondary structures have an initial crystalline orientation identical to the orientation of the primary structure, onto at least one support structure (B), the process comprising:
  a) the formation of at least one orientation mark (Va, Va1, Va2) when the secondary structures are fixed to the primary structure (A), the mark having an arbitrary orientation with respect to the said initial crystalline orientation, but identical for each secondary structure, and
  b) when a set of secondary structures is transferred onto at least one support structure (B), an arrangement of the secondary structures so that their orientation marks can be oriented in a controlled manner.

11 Claims, 5 Drawing Sheets

COMPOSITE STRUCTURE WITH A UNIFORM CRYSTAL ORIENTATION AND THE METHOD OF CONTROLLING THE CRYSTAL ORIENTATION OF ONE SUCH STRUCTURE

CROSS-REFERENCE TO RELATED APPLICATIONS

This application claims priority based on International Patent Application No. PCT/FR02/02136, entitled, "Composite Structure With Uniform Crystalline Orientation And Process For Controlling The Crystalline Orientation of Such A Structure" by Franck Fournel, Bernard Aspar and Hubert Moriceau, which claims priority of French Application No. 01 08257, filed on Jun. 22, 2001.

TECHNICAL FIELD

This invention relates to a composite structure with controlled crystalline orientation and a process for controlling the crystalline orientation of such a structure. It also relates to a process for making such a structure.

The invention is used in various applications, for example in the fields of microelectronics, integrated optics and micro-mechanics, and in particular is designed to supply large substrates with properties appropriate for their destination.

For example, the invention may be used to make composite substrates of the Si/Si, Si/Ge, Ge/Ge, Si/SiC, SiC/SiC, SiC/Ge types. It is also suitable for any other homogenous or heterogeneous combination of III-IV or II-VI semiconductors, diamond, silicon carbide, superconductors, magnetic materials, piezo-electric materials or more generally materials in textured polycrystalline or monocrystalline form. Crystalline materials may be combined with each other or with amorphous materials, or ceramic or plastic materials.

STATE OF PRIOR ART

Substrates, and particularly substrates used in the technical fields mentioned above, are more and more frequently composite substrates that comprise a support and a superficial part in which the components are made. A number of techniques are known for making such composite substrates.

These techniques consist essentially of transferring "secondary structure" layers, which are usually thin, from a primary or "donating" structure to a support or "receiving" structure.

Separation of the thin layer (or secondary structure) from the primary structure takes place by cutting, cleavage or fracture, a well-known technique described in document (1) for which the references are given at the end of the description. For example, this technique consists of forming a buried weakening layer in the primary structure and fracturing the primary structure along this layer to detach the secondary structure from it.

The cut, cleavage or fracture can be assisted by applying mechanical or thermal stresses. Tools for applying tension, shear, etching or peeling treatments, application of a fluid jet, and the use of a cutting laser are all means that can be used to provoke or facilitate separation of secondary structures from the primary structure.

An illustration is given in documents (2) and (3), the references of which are also given at the end of this description.

The secondary structures are then transferred onto the support structures to which they are bonded. This operation may make use of different bonding techniques with or without an adhesive substance, for example molecular bonding.

Transfer techniques for secondary structures are well known in themselves and are also illustrated in documents (4) to (7), the references of which are given at the end of this description.

One important parameter for transferring layers of crystalline material or more generally for transferring structures with at least one crystalline part, is the alignment of crystalline networks.

There are two alignments, firstly alignment between crystalline networks of transferred secondary structures, and secondly alignment of the crystalline network of secondary structures with the crystalline network of the support structure.

For the purposes of this document, alignment does not necessarily mean co-linearity of crystalline networks, but refers to control over the angle between the networks.

The "twist" angle is defined as being the angle of rotation between two crystalline networks about an axis perpendicular to the surface of the samples considered.

The "tilt" angle is defined as being the minimum rotation angle made about an axis parallel to the surface to align the vector normal to this surface with one of the three axes of the crystalline network of a crystalline layer of the structure. The surface tilt angles are used to define an "interface tilt" angle between two crystalline layers, each of which has a surface tilt angle. The values of the "twist" and "interface tilt" angles are defined such that the combination of these two rotations can align the two crystalline networks. In other words, there is a rotation between two crystalline structures to pass from one crystalline network to the other and that can be broken down into two rotations, one parallel and one perpendicular to the two surfaces between the two structures to be assembled. These rotations correspond to the interface twist and tilt angles. The angles can be defined between two crystalline structures one on top of the other or one at the side of the other.

Document (8) describes techniques for revealing the crystalline axes of a structure. These techniques involve chemical revelation of the axes and there are technical difficulties in applying them. Furthermore, this document does not provide any information about how to control the interface tilt or to make a controlled paving in the crystallographic direction. The need for a useful surface and the large amount of time are the main obstacles to revelation of crystalline axes. Furthermore, the precision at which the orientation of axes is known is usually not better than 0.1°.

Finally, it is possible to reveal crystalline axes by making X-ray measurements. Apart from the fact that these X-ray measurements take time, they are difficult to apply and their use is limited for thin films.

PRESENTATION OF THE INVENTION

The purpose of the invention is to propose a process for making composite structures comprising the transfer of at least one secondary structure derived from a primary structure onto a support structure, without the limitations mentioned above.

Another purpose is to propose a precise and simple process for controlling the orientation of secondary structures with respect to each other, or with respect to the support structure.

In order to achieve these purposes, the invention relates to a process for controlling the orientation of secondary structures with at least a crystalline part during the transfer of secondary structures from a primary structure on which the secondary structures have an initial crystalline orientation identical to the orientation of the primary structure or with a known misalignment with respect to the primary structure, onto at least one support structure. The process comprises:

a) formation of at least one orientation mark on each secondary structure when the secondary structures are fixed to the primary structure, the mark having an arbitrary orientation with respect to the said initial crystalline orientation, but allowing relative orientation of the secondary structure, and b) when secondary structures are transferred onto at least one support structure, an arrangement of the secondary structures so that their orientation marks can be oriented in a controlled manner.

If the secondary structures are monocrystalline, it is possible to provide marks with an identical orientation for each secondary structure.

A structure means an assembly formed from one or several layers that may have at least a part made from a crystalline material (monocrystalline or polycrystalline). In its simplest expression, it may be for example a unique crystalline layer that may or may not be covered with an amorphous layer or an amorphous layer covered by a crystalline layer. Note also that the support structure does not necessarily have a crystalline part. More complex structures, such as multi-layer structures, can also be selected.

Secondary structures may also be transferred on a single support structure or onto several such structures. In particular, the transfer may take place on several "daughter" support structures originating from the said same "mother" support structure. For example, this is the case when the "daughter" support structures are obtained by cutting, cleavage, or a fracture of a single crystal acting as a mother structure.

These "daughter" support structures then act as support structures. At least one orientation mark can be formed on each "daughter" support structure when it is fixed to the "mother" support structure, enabling relative orientation of "daughter" support structures.

Orientation marks may be formed before the transfer, for example such that after the transfer these marks are partly in the secondary structure (or in "daughter" structures) and in the primary structure (or in the "mother" structure). Thus the marks in these two types of structures have the same orientation with respect to the crystalline structure.

Marks may be made in one or several steps in the secondary (or "daughter") and primary (or "mother") structures. Steps for the transfer and production of new marks can then be inserted. Advantageously, new marks are made by using marks defined for the previous secondary (or "daughter") structure.

A precise angular alignment is thus possible during the transfer without it being necessary to include a step to reveal the crystalline directions. It is then easy to make an alignment from simple orientation marks. This alignment may be made between the secondary structures or even between each secondary structure and the support structure or between each secondary structure and "daughter" support structures.

Preferably, orientation marks are simple geometric shapes such as parallel lines, squares or any other form that may make an angular marking. In one improved embodiment of the process, the orientation marks may be graduated scales. This type of graduated scale is known in itself. They enable particularly precise angular adjustment. The marks may also be composed of the edges of secondary (or "daughter") structures.

For example, orientation marks may be made by lithography and etching or by laser drilling.

In particular, controlling the orientation of the orientation marks during transfer enables determination of the alignment of crystalline networks that existed in the primary structure. Furthermore, this does not require absolute knowledge of crystalline directions.

For example, the operation that consists of orienting the transferred secondary structures with respect to each other during transfer may include an angular alignment. It may also consist of respecting an angular offset given with respect to the orientation mark of one of the secondary structures used as the test structure. It may also consist of respecting an angular offset with respect to at least one other mark, for example fixed onto the support structure or the "daughter" support structures.

When the support structure itself is crystalline, or at least comprises a crystalline part, it may be desirable to orient the secondary structures with respect to each other, and also with respect to the crystalline orientation of the support structure or the "daughter" support structures.

In this case, after at least a first secondary structure has been transferred from a primary structure onto a support structure with at least one crystalline part, step b may include the determination of at least one offset angle of the crystalline orientations of the crystalline parts of the first transferred secondary structure and the support structure, and then when the subsequent secondary structures are transferred, adjustment of the arrangement of the marks on the support as a function of the determined offset.

The first transferred secondary structure used as a test may be oriented arbitrarily on the support structure.

The secondary test structure and any "daughter" structure may also be used to determine the offset. The orientation of the other secondary structures on one or the other "daughter" structures is then adjusted.

Note that in this process, neither knowledge of the crystalline orientation of the support structure nor knowledge of the secondary structures is necessary. All that is determined is the offset between the orientation of the crystalline structures, not an absolute orientation.

For example, the offset angle may be determined using a technique for measuring interface dislocations between the secondary structure and the support structure, for example by electronic transmission microscopy or by an X-ray technique for measuring an offset between the orientations of the crystalline parts. Further information about this subject is given in document (9), the references of which are included at the end of this description.

Other measurement techniques by chemical revealing, by optical or acoustic method or any other method sensitive to a crystalline offset, may also be used.

Compensation of crystalline orientation offsets determined between the first transferred structure(s) and the support structure(s) may for example take place by keeping a constant offset between the orientation of the marks of the subsequent secondary structures and the mark of the secondary test structure. The twist angles can thus be cancelled and the tilt angles can be reduced or also cancelled. Cancellation or compensation of the twist or tilt angle may be applied between secondary structures, or between secondary structures and the support structure, or between secondary structures and "daughter" support structures.

The invention also relates to a process for manufacturing composite structures comprising secondary structures fixed to at least one support structure. The process comprises:

delimitation of secondary structures with at least one crystalline part in a primary structure and transfer of secondary structures onto a support structure with at least one crystalline part, controlling the relative orientation of secondary structures and the support structure in accordance with the process described above.

Delimitation of secondary structures in the primary structure enables them to be transferred individually. According to one feature, the secondary structures may be delimited in the primary structure by a buried layer. For example, it may be a layer formed by implantation of hydrogen or rare gases. It can delimit a secondary structure each time and detach it from the primary structure using a fracture technique described in document (1) mentioned above.

Secondary structures can be fixed on the support structure by bonding with or without the addition of material (adhesive). For example, it may be a hydrophilic, hydrophobic, eutectic or anodic molecular bonding.

When secondary structures are fixed to a support structure, a layer of material may be formed on the free surface of these composite structures, for example by epitaxy. The crystalline part of the secondary structures is then used as a growth germ. If the secondary structures used as growth germs are arranged to be adjacent to each other, a layer formed by epitaxy may occupy a relatively large surface area. For example, the layer formed by epitaxy may cover a composite structure in the form of a 200 mm diameter disk. This can be particularly advantageous for III-V or II-VI semiconducting materials such as GaAs, InP or SIC. The diameters of monocrystals available for these materials at the moment are of the order of 100 mm and 50 mm respectively.

After epitaxy, the structure obtained may be used as a primary structure to repeat the process. The secondary structures do not necessarily cover the entire surface of the support structure. Advantageously, there may be one or several disorientations between the surface of the secondary structures and the surface of the support. During epitaxy is done on all structures, this can cause the appearance of grain boundaries at the junction between part of the deposited material for which the orientation is conform with the orientation of the surface of the secondary structure on which it began to grow, and part of the deposited material for which the orientation is conform with the orientation of the surface of the support structure on which it began to grow. This may be very useful for creating superconducting junctions at grain boundaries simply by using secondary structures.

The invention may also be used to make compliant substrates or pseudo-substrates. A pseudo-substrate is a substrate for which the mesh parameter is adapted to a material to be deposited by epitaxy, and a compliant substrate is a substrate that can accommodate epitaxy of materials with indifferent mesh parameters. In this case, the epitaxy may be done without inducing any defects, for example dislocations.

Finally, the invention relates to a composite structure with a first structure fixed to at least one second structure in which at least one of the first and second structures has uniformly oriented orientation marks. In particular, the orientation marks may be arranged on each side of a bonding interface.

Other advantages and specificities of the invention will become clear from the following description with reference to the figures in the appended drawings. This description is given purely for illustrative purposes and is in no way limitative.

DETAILED DESCRIPTION OF EMBODIMENTS OF THE INVENTION

In the following description, identical, similar or equivalent parts of the different figures have the same references. Furthermore, the different parts are not necessarily shown at the same scale for reasons of clarity in the figures.

Figure 1:
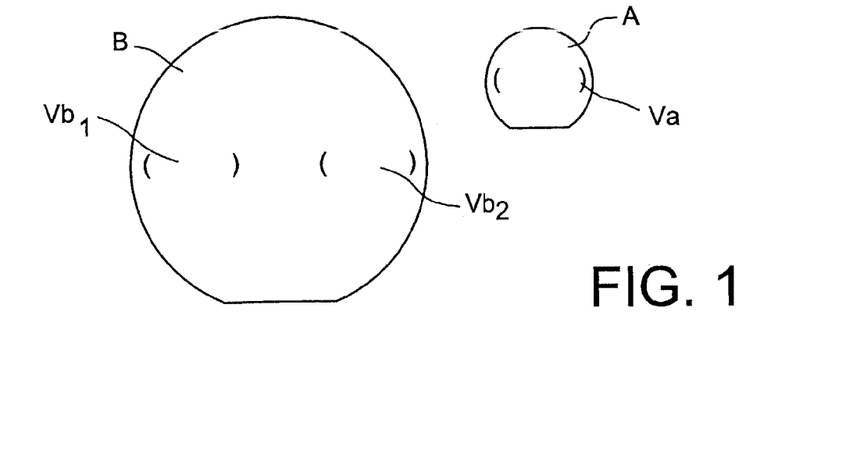
FIGS. 1 to 3 are top views of substrates showing transfer of thin layers with control of the crystalline orientation of these layers in accordance with the invention.

In a first embodiment of the invention, a first substrate A made of crystalline germanium with a diameter of 100 mm is used as a primary structure. A second substrate B made of crystalline silicon with a diameter of 200 mm is used as a support structure.

In a first step, an orientation mark Va is made in the form of a pair of graduated scales etched on a part of the surface of the first substrate. Two orientation marks Vb1, Vb2 of the same type as the mark Va on the first substrate are also made on the second substrate B. The marks on the second substrate are angularly centred and are aligned on the same diameter. They are made at distinct locations, and enable subsequent superposition with orientation marks on the first substrate (Va) when the secondary structures are bonded. The marks are made by photolithography and etching.

Figure 2:
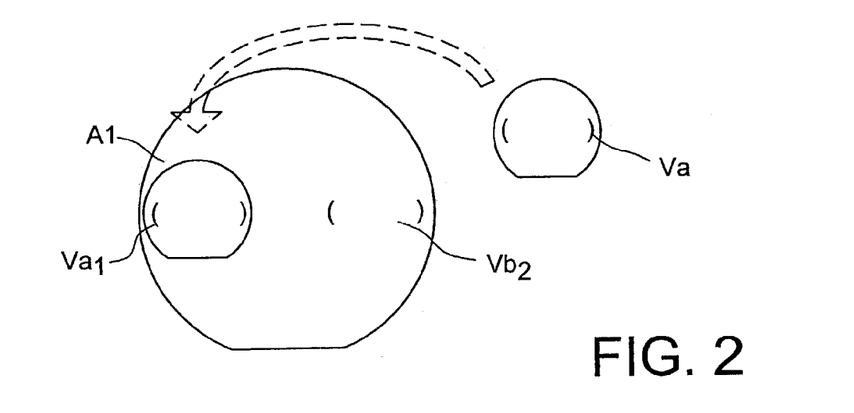

A first secondary structure, in the event a thin film A1, is detached from the first substrate A along a weakened zone, not shown, made by ionic implantation. The thin film A1 on which the orientation mark Va is marked, is transferred to the second substrate B in the region of the first orientation mark Vb1.

The transfer illustrated in FIG. 2 takes place without any orientation precaution.

An offset between the crystalline orientation of the second substrate B and the thin layer A1 is then measured. This operation may take place by sampling a test piece comprising a part of the two structures B and A1 in contact. The interface dislocations can be measured in a known manner, for example by TEM microscopy or by X-rays, and the interface dislocations can be measured and used to deduce the crystalline disorientation between B and A.

Figure 3:
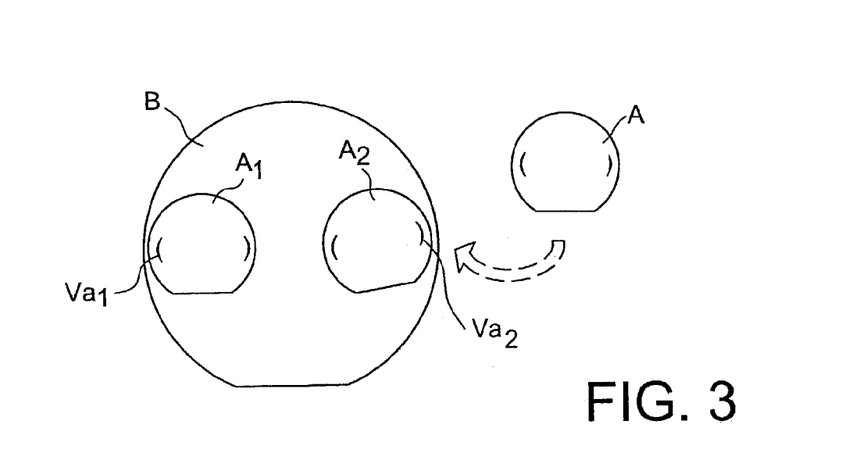

A second thin layer A2, on which an orientation mark Va2 is made identical to the mark Va1 of the first thin layer, is then detached from the same first substrate A and is also transferred onto the second substrate B. As shown in FIG. 3, the transfer takes place in the region of the second orientation mark Vb2 on this substrate, in other words adjacent to the first thin layer.

Advantageously, the mark Va1 that remained on the support is used, prolonging it to form the mark Va2. In this case, and although the crystalline orientation of the first substrate A is unknown, it is known that the second orientation mark Va2 has the same angular difference from the crystalline orientation of the second thin layer A2 as the angular difference between the first orientation mark Va1 from the crystalline orientation of the first thin layer A1.

Due to the orientation marks and knowledge of the orientation offset between the crystalline structures of substrate B and the first thin layer A1, the second thin layer A2 can be rotated until the required twist angle is obtained. The fact that secondary structures are lifted off by this method can give almost identical surface tilts for the secondary structures. Furthermore, since the tilt angle of the bonding interface depends on the twist angle, the tilt angle can be calculated as a function of the twist angle.

In particular, the second thin layer A2 may be oriented so as to reduce or even eliminate the difference between its orientation and the orientation of the support substrate B. This is done by rotating the second thin layer A2 and/or the support B about an axis perpendicular to the bonding plane.

The use of orientation marks in the form of pairs of graduated scales is a means of controlling alignments or twist angles or tilt angles with a precision of the order of one hundredth of a degree. Optical microscopy methods can be used to make this alignment. The wavelength is chosen to pass through at least one of the secondary or support structures when at least one mark is located at the bonding interface.

Figure 4:
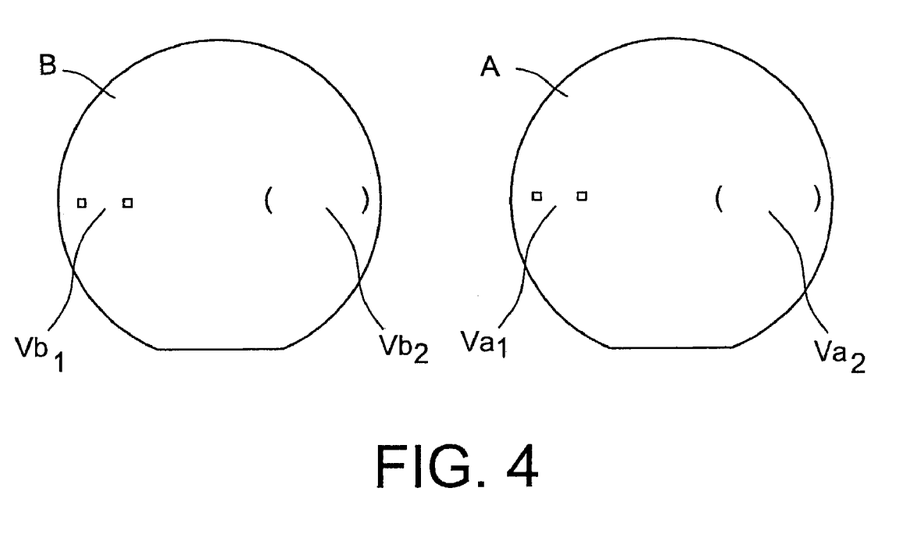
FIGS. 4 to 6 are top views of first and second substrates and illustrate the assembly of these substrates according to the invention.
Figure 5:
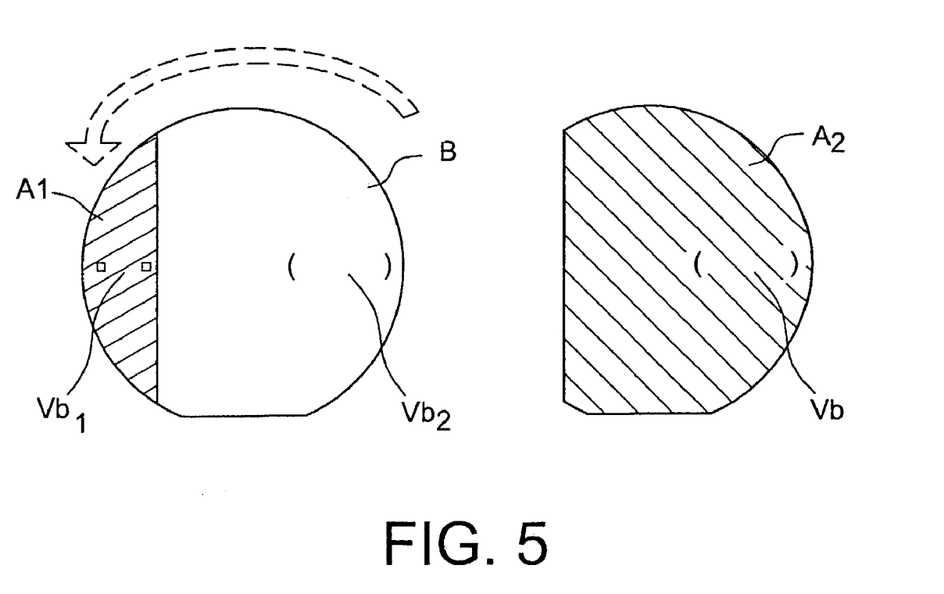
Figure 6:
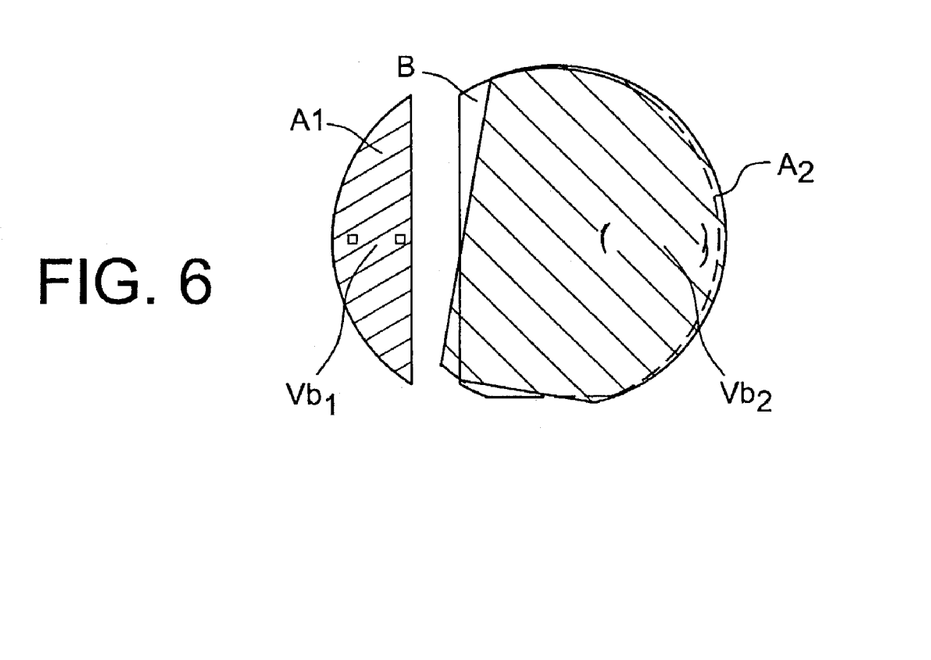

A second example embodiment of the process is illustrated in FIGS. 4 to 6. For simplification reasons, parts corresponding to parts in the previous figures are marked with the same references, even if their shape is slightly different.

In FIG. 4, the primary structure is a wafer of monocrystalline silicon A and the support structure is a wafer of monocrystalline silicon B. Two orientation marks index 1 and 2 are made at distinct locations on each of these wafers, mutually defining a fixed relative position identical for each wafer. These are the pairs of squares Va1, Vb1, and pairs of graduated scales Va2 and Vb2 respectively.

The first wafer A is then cut into two parts A1 and A2, marked with the orientation marks Va1 and Va2 respectively. As shown in FIG. 5, the part A1 marked with the orientation marks in the form of two squares is transferred and bonded on wafer B, making the squares coincide with the squares of the first orientation mark Vb1 on the second wafer B.

After this first transfer, the twist and tilt interface angles imposed by bonding the first part A1 onto the wafer B are determined as in the first example.

Since the graduated scales, in other words the second orientation marks Va2 and Vb2 were initially fixed in relation to the first orientation marks, in other words to the squares, the relative disorientation of the graduated scales is known; it is the offset determined between the crystalline directions of the first part A1 and the wafer B (twist) and the interface tilt.

When the second part A2 is transferred as illustrated in FIG. 6, it is then possible to control the twist angle and the interface tilt angle since the interface tilt angle depends on the twist angle, or at least to adjust it to a determined value by turning the second part A2 about an axis perpendicular to its bonding plane. The first and second parts in FIGS. 5 and 6 are cross-hatched to make it easier to understand the figures.

Figure 7:
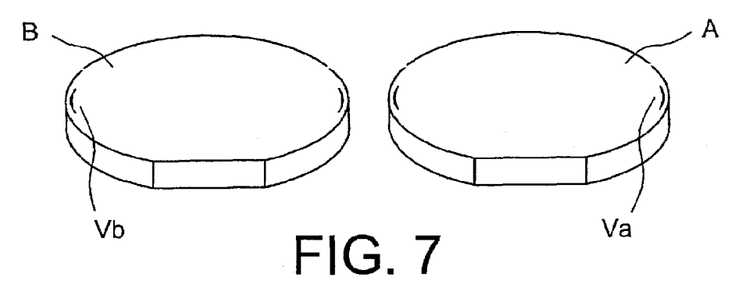
FIGS. 7 to 9 are diagrammatic representations of substrates and illustrate a technique for the assembly of several substrates in pairs, respecting their crystalline orientation in accordance with the invention.
Figure 8:
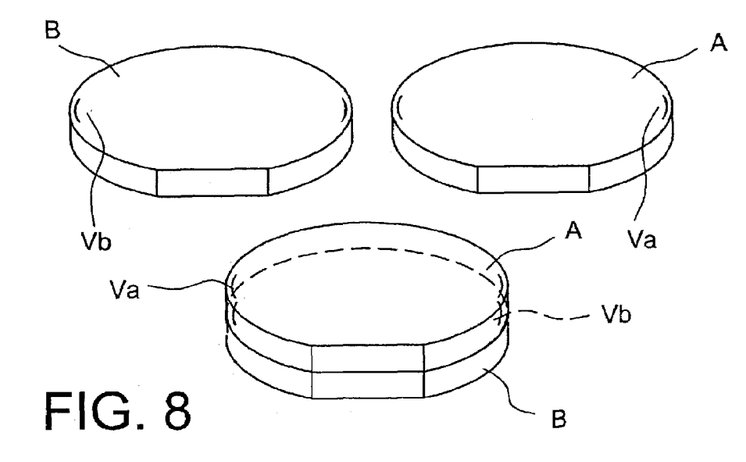
Figure 9:
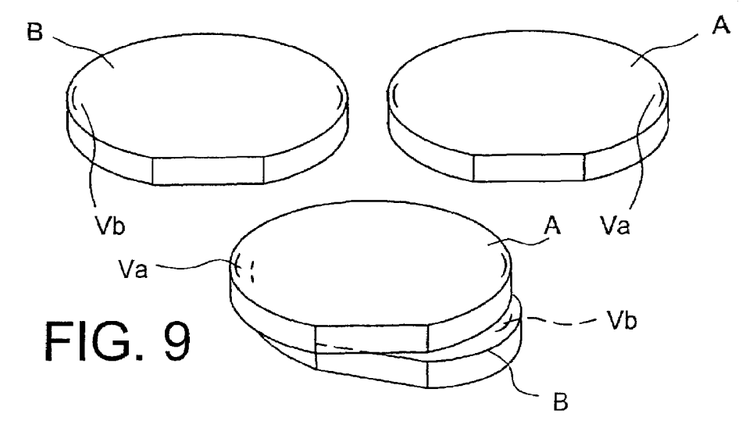

A third example embodiment of the process is illustrated in FIGS. 7 to 9. In this example, the secondary structures A1, A2, . . . are obtained by successive separation of a first substrate A used as a primary structure. The secondary structures are individually transferred onto a corresponding number of support structures B1, B2, . . . , obtained by successive separation of a second substrate B. The substrates A and B are shown in FIG. 7.

The verniers Va and Vb used as orientation marks are etched in the first and second substrates A and B at a sufficient depth to be located identically on all structures A1, A2, . . . , B1, B2, . . . , obtained subsequently by cleavage.

A first assembly of structures A1 and B1 originating from the first and second substrates A and B is made as shown in FIG. 8, by making an angular alignment of the verniers Va and Vb.

After assembling the two structures, the offset of their crystalline orientation is measured as in the previous examples.

Then, as shown in FIG. 9, the subsequent structures A2, B2, . . . , are assembled by providing a given angular offset in the alignment of their verniers Va and Vb. This offset may be selected to control the offset between the crystalline orientations.

When other subsequent structures originating from the first and second substrates A and B are assembled subsequently, an angular offset between their verniers Va and Vb is also controlled, which may be identical to the offset of the structures A2 and B2 in FIG. 9, or it may be different.

Figure 10:
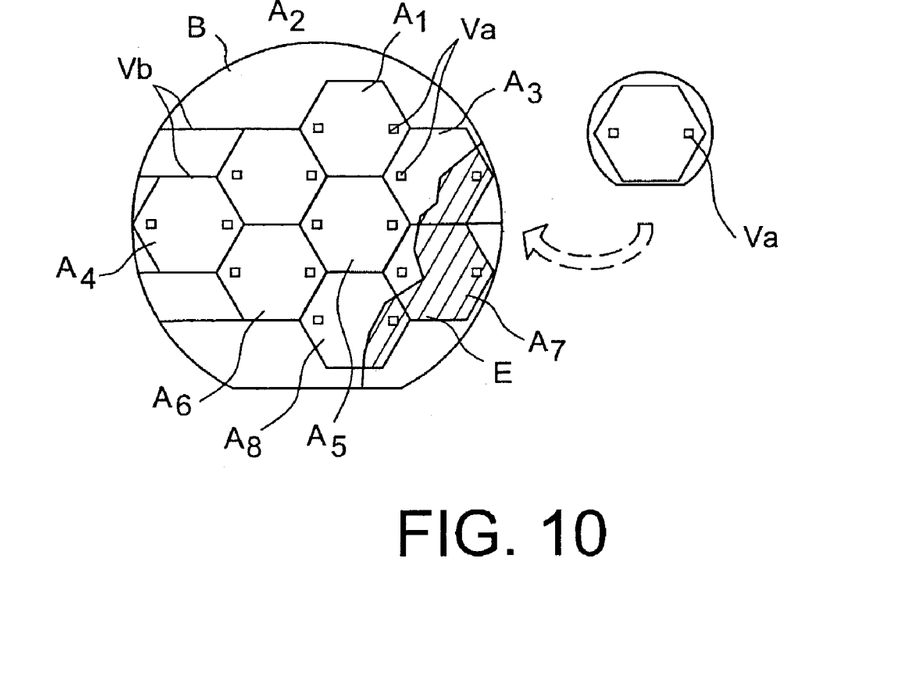
FIG. 10 shows the paving of a first substrate with several second substrates sampled on the same monocrystal in accordance with the invention.

Another example according to the invention and illustrated in FIG. 10 shows the transfer of several crystalline secondary structures A1, A2, . . . , A7, A8, . . . , onto a support structure B. The secondary structures all originate from the same primary structure and therefore all have the same orientation marks Va with the same orientation with respect to their crystalline network. The orientation marks Va are all similarly aligned on lines parallel to the support structure B. The parallel lines also comprise an orientation mark Vb of the support structure. The mutual crystalline alignment of the secondary structures and their uniform twist angle means that they can be used efficiently for epitaxy of an overlapping layer E that is partially shown. Note that in this example, the support structure B does not necessarily have a crystalline part.

All secondary structures A1, A2 may have the same dimensions. They may be in a form that enables an overlap of the support structure without interstices. In the event, they are hexagonal secondary structures.

Due to the transfer that maintains the crystalline orientation of the germs, and due to subsequent epitaxy, it is possible to obtain large diameter substrates with surface layers made of materials such as SiC or GaAs. For example, a substrate with a 200 mm diameter can be paved from a 35 mm diameter SiC monocrystal.

Variants of the embodiment of the process according to the invention may include a step in which one or several secondary structures are turned over. In particular, this makes it possible to choose the face that will be put into contact with the support structure and the face that will be epitaxied, if any. The process may be iterated, using the structure resulting from the assembly as a new donating structure or a new support structure. Intermediate steps may be carried out on it, for example such as material deposition and/or epitaxy, and/or polishing.

If the primary donating structures are sufficiently thick, the crystalline orientations of each with respect to each other may be determined in advance, particularly using X-rays.

It is thus possible to control the crystalline orientations of secondary structures during successive transfers.

Figure 11:
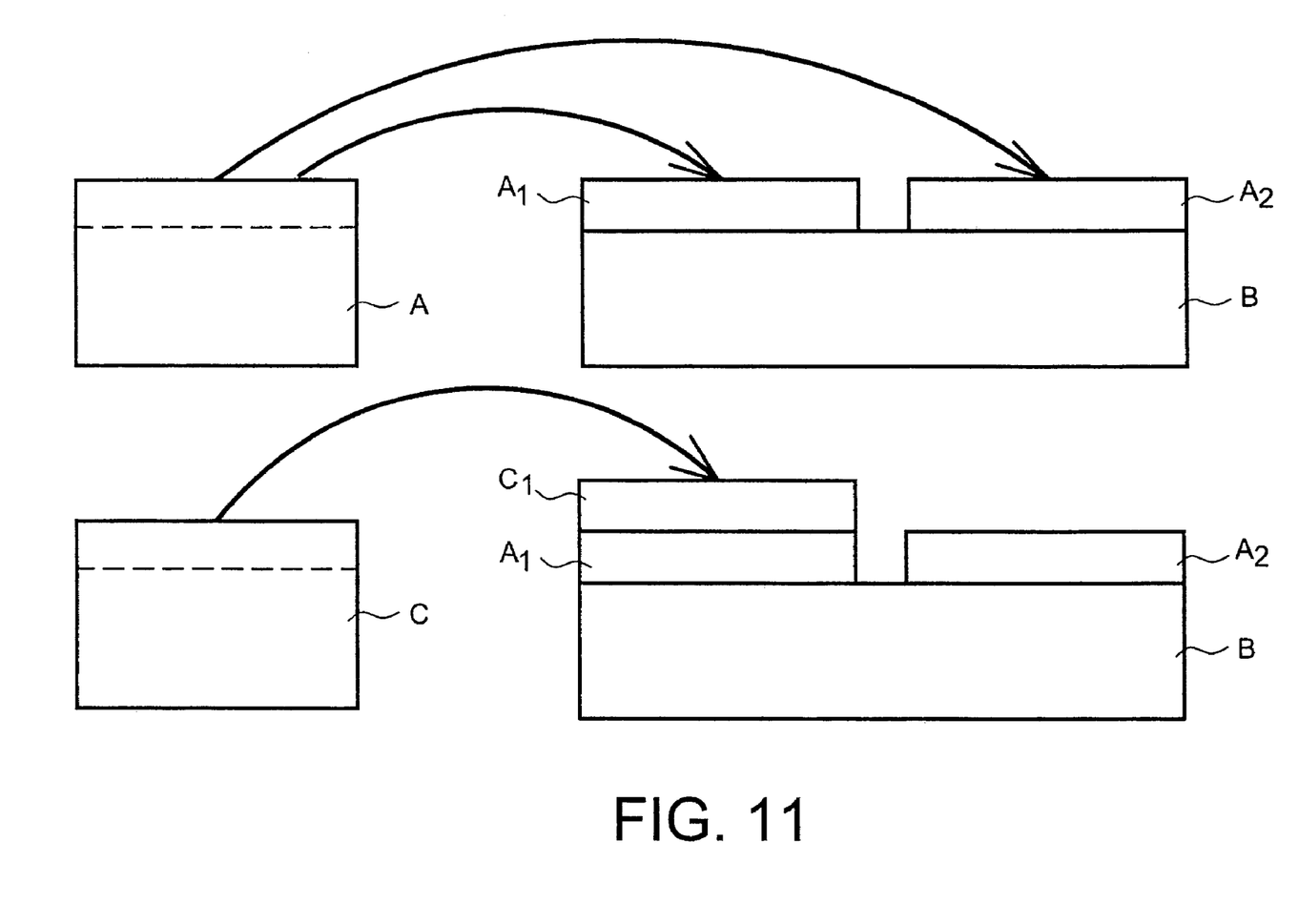
FIG. 11 shows donating and receiving substrates and illustrates an iterative application of the process according to the invention.

FIG. 11 shows the transfer of two secondary structures A1 and A2 to a support structure B, in sequence. The two secondary structures A1 and A2 originate from the same primary substrate A.

Subsequently, an additional secondary structure C1 originating from another primary structure C is then transferred to the first secondary structure A1, that will then be used as a support structure.

Knowledge of the relative crystalline orientations of the primary structures A and C makes it possible to control the relative orientations of the secondary structures A1 and C1 according to the invention.

REFERENCE DOCUMENTS (1) U.S. Pat. No. 5,374,564,
(2) K. Sakaguchi et al., 1999 IEEE International, SOI Conference, October 1999, p. 110
(3) F. Henley et al., European Semiconductor, February 2000, p. 25
(4) FR-A-2 681 472
(5) FR-A-2 748 850
(6) FR-A-2 748 851
(7) FR-A-2 781 082
  (8) "Angular alignment for wafer bonding" Chou et al., SPIE, vol. 2879, 1996, pages 291-299
(9) "Grazing Incidence, X-ray studies of twist-bonded Si/Si and Si/SiO$_2$ interface", D. Buttard et al., PhysicaB, 283 (1-3) (2000), P. 103.

The invention claimed is:

1. Process for controlling an orientation of secondary structures having at least one crystalline part, during a transfer of the secondary structures from a primary structure on which the secondary structures have an initial crystalline orientation identical to an orientation of the primary structure or with a known misalignment with respect to the primary structure, onto at least one support structure, the process comprising:
   a) forming at least one orientation mark when the secondary structures are fixed to the primary structure, the orientation mark having an arbitrary orientation with respect to the initial crystalline orientation, but allowing relative orientation of the secondary structure, and
   b) transferring a set of secondary structures on the at least one support structure, by orientating the transferred secondary structures with respect to each other in a controlled manner with the help of the orientation marks.

2. Process according to claim 1, during a transfer of at least one secondary structure from the primary structure onto a support structure with at least one crystalline part, wherein step b) includes:
   determining at least one offset angle of the crystalline orientations between the crystalline parts of a first secondary structure and the support structure after the transfer of the first secondary structure onto the support structure with an arbitrary arrangement of the orientation mark of the secondary structure, and
   when the subsequent secondary structures are transferred, adjusting the arrangement of the orientation marks as a function of the determined offset angle.

3. Process according to claim 2, wherein the offset angle is determined using at least one of:
   a technique of measuring interface dislocations between the secondary structure and the support structure; or
   a technique for using X-rays to measure an offset between the orientations of the crystalline parts.

4. Process according to claim 2, wherein at least one orientation mark is also formed on the support structure, and wherein the orientation marks of the secondary structures are oriented with respect to the orientation marks of the support structure.

5. Process according to claim 1, wherein the orientation marks are formed using lithography and etching techniques.

6. Process according to claim 1, wherein the orientation marks are formed in the form of parallel lines, verniers or squares.

7. Process according to claim 1 further including the step of:
   delimitation of the secondary structures having at least one crystalline part in the primary structure.

8. Process according to claim 7, further comprising epitaxy of a layer covering all of the secondary structures bonded to the same support structure after the transfer, the epitaxy using the crystalline part of each secondary structure as a growth germ.

9. Process according to claim 8 wherein epitaxy is used to form a layer extending at least partly onto a secondary structure and at least partly onto the support structure, in order to form at least one grain boundary.

10. Process according to claim 7, wherein the delimitation of the secondary structures takes place by cutting or by formation of a separation layer in the primary structure.

11. Process according to claim 7, wherein the transfer step comprises the separation of at least one secondary structure from the primary structure and bonding of the secondary structure onto the support structure.

* * * * *